United States Patent [19]
Houston et al.

[11] Patent Number: 6,037,808
[45] Date of Patent: Mar. 14, 2000

[54] DIFFERENTIAL SOI AMPLIFIERS HAVING TIED FLOATING BODY CONNECTIONS

[75] Inventors: Theodore W. Houston, Richardson; Patrick W. Bosshart, Plano, both of Tex.

[73] Assignee: Texas Instruments Incorporated, Dallas, Tex.

[21] Appl. No.: 08/998,337

[22] Filed: Dec. 24, 1997

[51] Int. Cl.[7] .................................................. G11C 7/06
[52] U.S. Cl. .............................. 327/55; 327/57; 327/534
[58] Field of Search .................................. 327/51–57, 65, 327/66, 67, 534, 537, 307, 362; 330/253; 365/190, 207, 208, 154, 156; 257/288, 314, 315

[56] References Cited

U.S. PATENT DOCUMENTS

| | | | |
|---|---|---|---|
| 5,113,092 | 5/1992 | Herold | 327/65 |
| 5,227,673 | 7/1993 | Ta | 327/537 |
| 5,461,338 | 10/1995 | Hirayama et al. | 327/534 |
| 5,646,900 | 7/1997 | Tsukude et al. | 365/205 |
| 5,672,995 | 9/1997 | Hirase et al. | 327/534 |

OTHER PUBLICATIONS

J.A. Mandelman, F. Assaderaghi, and L.L. Hsu; "SOI MOS-FET Mismatch Due to Floating–body Effects", pp. 164–165 of 1997 IEEE International SOI Conference Proceedings, dated Oct. 6–9, 1997.

Primary Examiner—Toan Tran
Attorney, Agent, or Firm—Robby T. Holland; Carlton H. Hoel; Richard L. Donaldson

[57] ABSTRACT

An integrated circuit ($SAI_0$) comprises a first SOI transistor (T4) comprising a plurality of nodes, the plurality of nodes comprising a first source/drain, a second source/drain, a gate for receiving a potential to enable a conductive path between the first source/drain and the second source/drain, and a body terminal coupled to a body region disposed between the first source/drain and the second source/drain. The integrated circuit further includes a second SOI transistor (T5) comprising a plurality of nodes, the plurality of nodes comprising a first source/drain, a second source/drain, a gate for receiving a potential to enable a conductive path between the first source/drain and the second source/drain, and a body terminal coupled to a body region disposed between the first source/drain and the second source/drain. In the integrated circuit, one of the plurality of nodes of the first SOI transistor is connected to receive a first differential input signal. Moreover, a same one of the plurality of nodes of the second SOI transistor is connected to receive a second differential input signal. Lastly, the body of the first SOI transistor is connected to the body of the second SOI transistor and the bodies of the first and second SOI transistors are connected to float.

34 Claims, 6 Drawing Sheets

DIFFERENTIAL SOI AMPLIFIERS HAVING TIED FLOATING BODY CONNECTIONS

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to transistor circuits, and are more particularly directed to differential silicon-on-insulator ("SOI") amplifiers having tied floating body connections.

The technology of many modern circuit applications continues to advance at a rapid pace, with one incredibly prolific type of circuit, and one which is highly developed, being digital memory. For such memories, consideration is given to all aspects of design, including maximizing efficiency and increasing performance. These considerations may be further evaluated based on the integrated circuit device in which the memory is formed, where such circuits may be implemented either as stand-alone products, or as part of a larger circuit such as a microprocessor. One often critical factor with respect to digital memories is the cost of the device. This cost is typically reflected in the overall size of the memory architecture. Another factor with respect to digital memories often includes the performance factor of overall circuit speed. Thus, a desirable memory reduces device size while providing acceptable functionality and speed.

In the current art, memory size may be affected by various factors. In one prior art approach, as detailed later, this size is affected by a connection used in each of the sense amplifiers of the memory configuration. Specifically, it is known in the memory art to include sense amplifier transistor configurations for either a dynamic random access memory (DRAM) or a static random access memory (SRAM). In either case, each sense amplifier transistor configuration includes two cross-coupled transistors connected to sense a differential voltage from one of the columns of the memory array. More particularly, the cross-coupled transistors amplify a small voltage difference, which represents the binary value being sensed, to a full scale signal. In the case of an SRAM, the differential voltage is measured between two bitlines. In the case of a DRAM, the differential voltage is measured between a bitline and a reference bitline. In either case, however, the cross-coupled transistor configuration which senses the differential voltage remains the same. Moreover, under current memory architectures, these cross-coupled transistors are sometimes formed using silicon-on-insulator (SOI) technology. In this instance, it is common to tie the body of each of the cross-coupled transistors to the source of the corresponding transistor. This is commonly done so that the body of each transistor is fixed to a known potential, rather than permitting the body potential to fluctuate which could otherwise occur due to the tendency of the body potential to deviate due to the signal conditions experienced by the transistor. While these source-to-body connections therefore provide acceptable operational performance, they also provide a drawback in that they require an additional connection per transistor and, thus, consume additional area on the integrated circuit in which the memory configuration is formed.

The above considerations and drawbacks are presented in more detailed fashion below. Additionally, however, note at the outset while the above is set forth in the context of digital memories, various of the same or similar considerations arise in other integrated circuits as well. Thus, in any of these contexts, there is a need to address these drawbacks, as is accomplished by the preferred embodiments which thus provide a more efficient and desirable integrated circuit configuration.

BRIEF SUMMARY OF THE INVENTION

In one preferred embodiment, there is an integrated circuit. The integrated circuit comprises a first SOI transistor comprising a plurality of nodes, the plurality of nodes comprising a first source/drain, a second source/drain, a gate for receiving a potential to enable a conductive path between the first source/drain and the second source/drain, and a body terminal coupled to a body region disposed between the first source/drain and the second source/drain. The integrated circuit further includes a second SOI transistor comprising a plurality of nodes, the plurality of nodes comprising a first source/drain, a second source/drain, a gate for receiving a potential to enable a conductive path between the first source/drain and the second source/drain, and a body terminal coupled to a body region disposed between the first source/drain and the second source/drain. In the integrated circuit, one of the plurality of nodes of the first SOI transistor is connected to receive a first differential input signal. Moreover, a same one of the plurality of nodes of the second SOI transistor is connected to receive a second differential input signal. Lastly, the body of the first SOI transistor is connected to the body of the second SOI transistor and the bodies of the first and second SOI transistors are connected to float. Other circuits, systems, and methods are also disclosed and claimed.

BRIEF DESCRIPTION OF THE SEVERAL VIEWS OF THE DRAWING

FIG. 2b illustrates various diode and capacitor effects of the configuration of the SOI transistor of FIG. 2a;

FIG. 3b illustrates a cross-sectional view of the semiconductor fabrication of one of the transistors shown in the plan view of FIG. 3a;

FIG. 5b illustrates a cross-sectional view along line 5b—5b shown in the plan view of FIG. 5a;

FIG. 5d illustrates a cross-sectional view along line 5d—5d shown in the plan view of FIG. 5c;

FIG. 6b illustrates a cross-sectional view along line 6b—6b shown in the plan view of FIG. 6a;

FIG. 7b illustrates a cross-sectional view along line 7b—7b shown in the plan view of FIG. 7a;

DETAILED DESCRIPTION OF THE INVENTION

As appreciated below, the embodiments contemplated within the present inventive scope relate to differential amplifier transistor circuits constructed using silicon-on-insulator ("SOI") technology. One area in which such circuits arise, and one which derives particular benefits when implemented consistent with the present invention, involves digital memories. Thus, the following discussion first details the implementation of various embodiments in the context of such a digital memory, with it later explained and demonstrated that alternative embodiments are also within the inventive teachings of the current document.

Before proceeding with a detailed discussion of the preferred inventive embodiments and by way of presenting a more extensive introduction, FIGS. 1a through 2b as well as the following discussion present an explanation of a prior art integrated circuit 10 including a memory configuration 20, concluding with some observations about prior art drawbacks as improved upon by the preferred embodiments. Integrated circuit 10 is typical of that in the art and, thus, includes components formed using a semiconductor substrate and various layers formed above that substrate. In the present example, integrated circuit 10 implements silicon-on-insulator ("SOI") technology. As known in the art, therefore, an insulator layer (typically silicon dioxide) is formed over the entire semiconductor substrate, and various devices are then formed over this insulator. To form these additional devices, a layer of silicon is placed over the insulator, thereby giving rise to the SOI name. Moreover, this silicon layer is then appropriately etched and doped to form the various desired devices. To better appreciate these principles for the example of memory configuration 20, the layout of a memory cell is discussed below in connection with FIG. 2a. Before reaching that discussion, however, certain schematic details are first addressed in the context of FIGS. 1a and 1b.

Figure 1A:
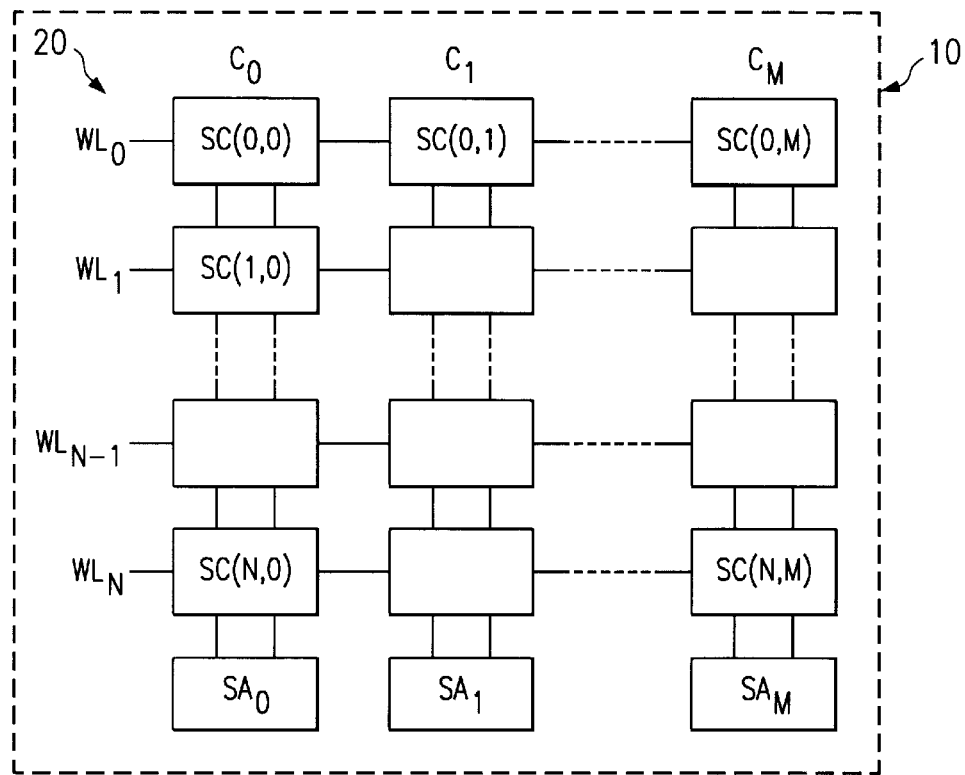
FIG. 1a illustrates a prior art integrated circuit including a memory configuration formed in an array fashion and having sense amplifier circuits for sensing differential signals from the paired columns of the array.

Looking in detail to FIG. 1a, it illustrates a prior art memory configuration 20 generally in a combined block and schematic form. Memory configuration 20 is generally connected in an array form, thereby presenting a number of wordlines $WL_0$ through $WL_N$ each aligned in the x-dimension and a number of columns $C_0$ through $C_M$ each aligned in the y-dimension. At the intersection of each wordline and column is a storage cell abbreviated SC, and some of which are shown by way of example as having a coordinate (WL,C) such that the first element specifies the wordline corresponding to the storage cell and the second element specifies the column corresponding to the storage cell. The array nature of memory configuration 20 permits either writing data to, or reading data from, a storage cell on a wordline basis. In other words, one or more storage cells along the same wordline may be accessed (i.e., for either read or write) at a time. The preferred embodiments described below are directed primarily to the reading of data and, thus, details of writing data are not provided so as to simplify the remaining discussion.

Memory configuration 20 also includes sets of paired column conductors such that each pair of conductors extends between storage cells along a same column. These conductors may be one of two types, depending on the type of memory implemented by memory configuration 20. More specifically, note that memory configuration 20 may be either a static random access memory (SRAM) or a dynamic random access memory (DRAM). In the case of the SRAM, each storage cell stores data using a cross coupled transistor configuration whereas in the case of a DRAM each storage cell stores data using some type of capacitive element. In either case, however, for purposes of reading data from the cell, the two columnar oriented conductors provide two respective signals to be compared to one another to determine the data stored at a cell along a selected one of the wordlines. For an SRAM, the two column conductors are referred to as bitlines and the potential at either may change with respect to the other thereby presenting a differential signal between them representing the data stored in a given storage cell. For a DRAM, sometimes one of the column conductors is referred to as a bitline which carries the potential of the storage device of the cell while the other of the column conductors is referred to as a reference bitline which maintains, as its name suggests, a reference potential to be compared against the other bitline. Given the above, note that for both an SRAM and a DRAM, two signals are presented along the corresponding column conductors.

Importantly in the context of the preferred inventive embodiments described later, note that the signals provided by the column conductors in FIG. 1a are connected to corresponding sense amplifier circuits, shown as $SA_0$ through $SA_M$. For purposes of discussion, the subscript of each of the sense amplifier circuits matches that of the column to which it corresponds. As detailed below, each of sense amplifier circuits $SA_0$ through $SA_M$ includes circuitry for "sensing" the differential voltage along the paired column conductors by amplifying it. Typically, the differential voltage is either amplified to a full scale signal, or there may be stages which amplify the current drive to some level having a lesser signal swing then a full scale signal. This signal may then be used either by other circuitry, either internally on integrated circuit 10 or external from that device. Note also that FIG. 1a illustrates each sense amplifier circuit as connected only to a single pair of corresponding column conductors by way of example, whereas other variations may exist in the correlation between column conductors and sense amplifier circuits. In other words, as an alternative to that shown in FIG. 1a, an embodiment may be created where more than two column conductors are connected by some multiplexing functionality to a single sense amplifier circuit; thus, one pair of these multiple column conductors may then be selected at a time to provide a differential signal to the sense amplifier circuit. Any of these alternatives are within the current description and, as appreciated later, are also contemplated within the inventive scope as applying to differential amplifiers in general.

Figure 1B:
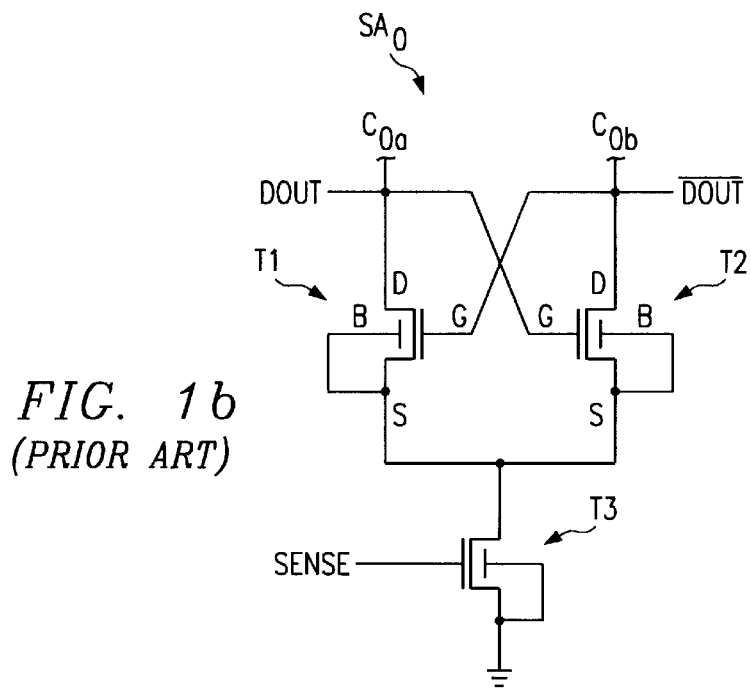
FIG. 1b illustrates a prior art schematic of a sense amplifier circuit.

FIG. 1b illustrates a schematic of a prior art sense amplifier circuit $SA_0$ in greater detail, with it understood that each of the remaining sense amplifier circuits of FIG. 1a is constructed in the same manner (and, of course, connected to a different pair of column conductors). At the outset, note for further discussion that the column conductors from column $C_0$ are further distinguished in FIG. 1b from one another by adding the letters "a" and "b" to the subscripts for these conductors. Sense amplifier circuit $SA_0$ includes two cross-coupled n-channel transistors designated T1 and T2. By cross-coupled, it is meant that the drain of transistor T1, which is connected to receive the signal from conductor $C_{0a}$, is also connected to the gate of transistor T2. Similarly, the drain of transistor T2, which is connected to receive the signal from conductor $C_{0b}$, is also connected to the gate of transistor T1. The sources of T1 and T2 are connected to one another, and are further connected to the drain of an enable n-channel transistor T3. It should be appreciated further that sense amplifiers may typically include additional transistors, such as cross-coupled p-channel transistors, which are not shown here for simplicity. Of key note for purposes of appreciating the preferred embodiments described later, note that for transistors T1 and T2, the body of each is connected to its corresponding source. This connection is fairly typical in the SOI art, and is typically done to ensure that the body of the SOI transistor is connected to some known potential and to avoid capacitive effects described later. Looking lastly to enable transistor T3, its source is connected to ground and its gate is connected to receive a SENSE signal. One skilled in the art will therefore appreciate that when SENSE is asserted, enable transistor T3 conducts and connects the sources of transistors T1 and T2 to ground. Accordingly, transistors T1 and T2 then amplify the differential signal along conductors $C0_a$ and $C0_b$, and the result and its complement may be read from outputs DOUT and $\overline{DOUT}$, respectively.

Figure 2A:
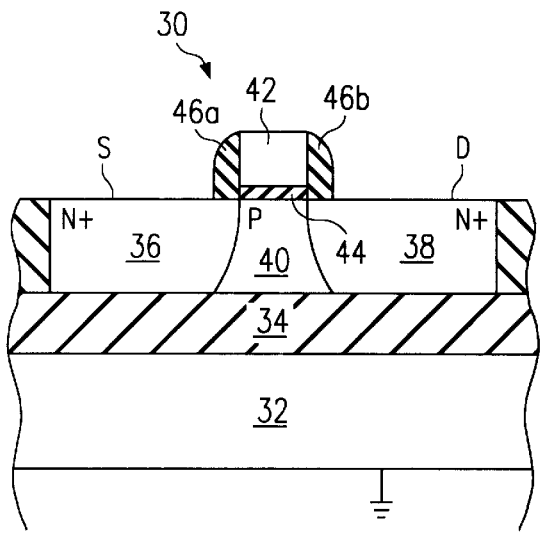
FIG. 2a illustrates a cross-sectional view of the semiconductor fabrication of a silicon-on-insulator (SOI) transistor.

To further appreciate the body-to-source connections of transistors T1 and T2 of FIG. 1b, FIG. 2a illustrates a cross-sectional view of a prior art SOI transistor designated generally at 30 and, thus, of the type which may be used to form transistors T1 and T2. Starting at the bottom of the Figure, transistor 30 includes a semiconductor substrate 32 which is a layer of P+ semiconductor and is typically connected to ground. As the SOI name suggests, an insulating layer 34 is formed over substrate 32. Overlying insulating layer 34 are various regions which give rise to the various pn junctions and gate operation of the device. Specifically, two N+ regions 36 and 38 are formed over insulating layer, where one of these regions operates as the source of transistor 30 while the other operates as its drain. For purposes of the remaining discussion, assume that N+ region 36 is the transistor source and N+ region 38 is the transistor drain. Between regions 36 and 38 is the body 40 of the device, which is formed by a P semiconductor region. A a gate 42 is formed over body region 40, with a gate insulator 44 formed between gate 42 and body 40. Lastly, insulating sidewalls 46a and 46b are formed on the sides of gate 42.

Having set forth the various parts of transistor 30, reference is now directed to the general operation of the device as well as various of its electrical attributes. Specifically, one skilled in the art will readily acknowledge a positive gate-to-source voltage as applied to transistor 30 permits electrical charge to conduct between regions 36 and 38, by way of a charge path formed in body 40. However, note now some additional observations which arise from the various interfaces between the parts of transistor 30, as further illustrated schematically in FIG. 2b. First, note that the structure of transistor 30 gives rise to four capacitive interfaces, shown as capacitors C1 through C4 in FIG. 2b. Two of these capacitors, namely C1 and C2, are formed between body 40 and regions 36 and 38 due to the charge layer which forms in body 40 during the operation of transistor 30. A third capacitor, C3, exists between gate 42 and body 40 (i.e., due to gate insulator 44). Finally, a fourth capacitor, C4, exists between body 40 and substrate 32 (i.e., due to insulator layer 34). Second, note that the structure of transistor 30 gives rise to two diodes (i.e., pn junctions), the first being between shown in FIG. 2b as diode D1 between body 40 and region 36, and the second being shown as diode D2 between body 40 and region 38.

Figure 2B:
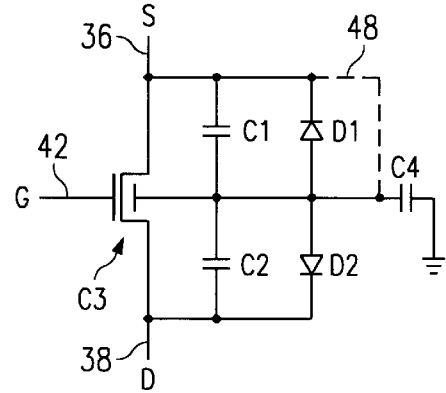

Given the illustrations of FIGS. 2a and 2b, attention is now directed to the possible effects of various of the above-introduced capacitors and diodes. To better appreciate these effects, consider the possible consequences if the body of a single SOI transistor is not connected at all (i.e., is left floating). Particularly, assume over time that the transistor is enabled in numerous instances. In other words, during each of these instances the gate-to-source voltage is positive. As a result, the body voltage will tend toward the source voltage due to diode D1. However, if the body voltage moves more positive, then there may be conduction through diode D1 while if the body voltage moves more negative, then there may be reverse leakage current across that diode. As another observation, note further that if body 40 floats, then due to the various capacitances a change in any of the voltages at any of the source, drain, or gate, will tend to pull the body voltage in the same direction as the change in source, drain, or gate voltage. Concluding, therefore, one skilled in the art will appreciate that the body voltage, and hence the threshold voltage of the SOI transistor, will fluctuate in response to the recent signal history of the device.

Having understood the above, note now the result of tying the body to the source as is typical in the prior art and in the case of transistors T1 and T2. To appreciate this effect, note that FIG. 2b further illustrates a connection 48 shown in phantom, where that connection actually exists when the body is tied to the source of the SOI transistor. Given connection 48, note that it effectively short circuits any effect of capacitor C1 and diode D1. Thus, various of the tendencies of the body voltage described above are removed by connection 48. In addition, if the source of the device is connected to a known potential (e.g., ground), then the body potential is likewise fixed by connection 48 and thus is not influenced by other potentials as well (e.g., a potential as applied to gate 42 or drain region 38). Given these effects, it now should be appreciated why the prior art emphasizes connecting the transistor body to the transistor source as is the case for various schemes including that of memory configuration 20 of FIGS. 1a and 1b, especially where matching of transistor threshold voltages is important.

Figure 3A:
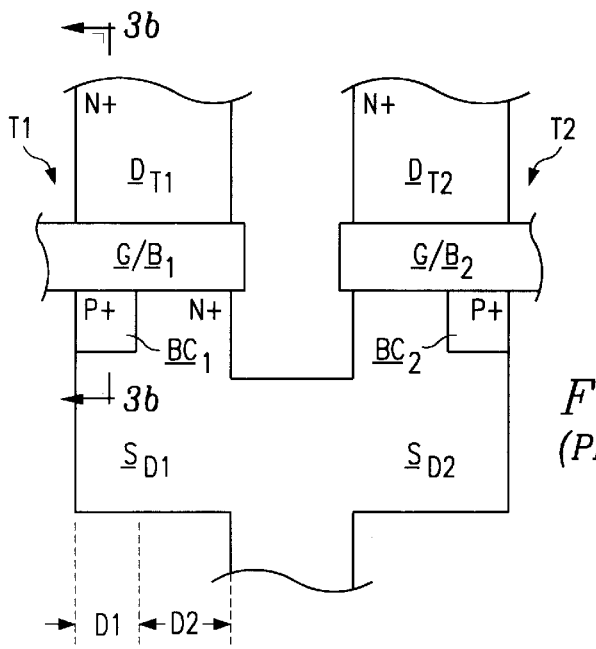
FIG. 3a illustrates a plan view of the semiconductor fabrication of the cross-coupled transistors of FIG. 1b.
Figure 3B:
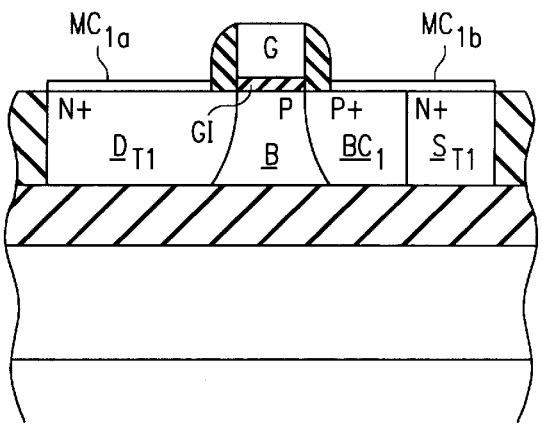

As a final means for purposes of later comparison to the preferred embodiment, FIG. 3a illustrates a plan view of the integrated circuit layout of the cross-coupled transistors T1 and T2 from FIG. 1b, while FIG. 3b illustrates a cross-sectional view of transistor T1 taken along line 3b in FIG. 3a. Each of transistors T1 and T2 is formed in the same general manner and, thus, the following discussion is directed at transistor T1 with one skilled in the art understanding the like principles as applied to transistor T2.

To the top left of FIG. 3a is shown an N+ semiconductor region which forms the drain of transistor T1 and, hence, is labeled $D_{T1}$. Adjacent to drain $D_{T1}$ is the gate conductor, labeled $G/B_1$ in FIG. 3a. The "G" in this designation indicates that the gate is formed as shown, and note further that the "G" designation is used without the accompanying "B" in the cross-sectional view of FIG. 3b. In the plan view of FIG. 3a, however, this designation includes the "B" as an indication that the P type body underlies the gate conductor as better appreciated from the view of FIG. 3b (of course, gate G is separated from body B by a gate insulator GI). Continuing down the left side of FIG. 3a, below the gate and body $G/B_1$ is the source $S_{T1}$ of transistor T1, again formed by an N+ semiconductor region. Note further, that a width D1 of the area immediately adjacent gate and body region $G/B_1$ is consumed by a P+ body contact $BC_1$, which is included for reasons evident below. Before reaching that discussion, note that due to the body contact semiconductor type as well as the high dopant concentration of $BC_1$, it provides an electrical connection to P type body region B. Additionally, note that metal contact areas, typically formed by metal silicides, are formed over the source and drain regions of transistor T1 and are shown in FIG. 3b as metal contacts $MC_{1a}$ and $MC_{1b}$ (not shown in FIG. 3). Thus, metal contact $MC_{1b}$ connects source $S_{T1}$ to body contact $BC_1$, and from the above recall that body contact $BC_1$ is electrically connected to body B. Thus, as shown schematically in FIG. 1b, the source of transistor T1 is electrically connected to the body of transistor T1.

Given the existence of the body contacts for transistors T1 and T2, respectively, note their effect on device size for purposes of later contrast to the preferred embodiments. Specifically, for a given implementation, it will be desired that transistors have a certain channel width. This width is shown as D2 in FIG. 3a. However, for purposes of constructing T1 and T2 to include the respective body contacts $BC_1$ and $BC_2$, note that the actual width of the semiconductor region immediately adjacent the gate conductor for each transistor must be increased by D1. Stated alternatively, this semiconductor region is of a width equal to D1+D2, and indeed the remaining semiconductor region beyond that area may well be extended to that same D1+D2 width as well. Lastly, note also that the extra width created by D1 introduces a penalty in gate capacitance in addition to an increase in device area.

Figure 4:
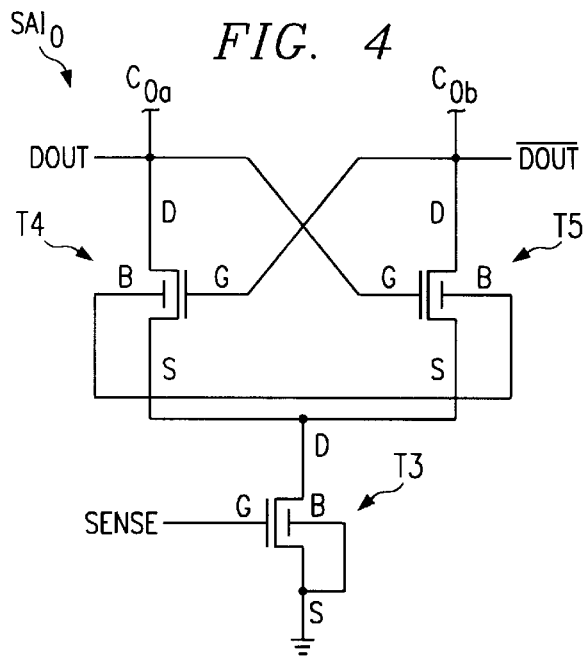
FIG. 4 illustrates a schematic of a sense amplifier circuit in accordance with the present inventive embodiments.

FIG. 4 illustrates a schematic of a sense amplifier $SAI_0$ in accordance with the present inventive embodiments and, more particularly, as a substitute for sense amplifier $SA_0$ as shown in FIG. 1b and thereafter detailed in FIGS. 3a and 3b. Thus, for sake of providing a distinction in the reference indicators, note that an "I" is added to the designation of the sense amplifier circuit of FIG. 4 to generally distinguish it from the sense amplifier circuit of FIG. 1b. However, it should be understood that other than the schematic and layout considerations presented below, it is intended that for the present inventive embodiments that a memory configuration may be constructed in the same manner as shown in FIG. 1a, but substituting a sense amplifier circuit of the type shown by sense amplifier circuit $SAI_0$ in place of each of the sense amplifier circuits shown in FIG. 1a. Thus, the preferred embodiments contemplate an integrated circuit with sense amplifier circuits consistent with the discussion below and configured in a general sense as a memory configuration such as configuration 20. Moreover, the integrated circuit including such a memory configuration 20 may be of various different types, including but not limited to a stand alone memory integrated circuit, an application specific integrated circuit, a digital signal processor, or a microprocessor. Moreover, the integrated circuit may be constructed using semiconductor fabrication principles ascertainable to one skilled in the art, with certain aspects of the present inventive embodiments arising from the connections and possible layout considerations as appreciated from the following discussion.

Turning now to the details of sense amplifier circuit $SAI_0$ of FIG. 4, it is first instructive to review the similarities between it and the prior art. In this regard, sense amplifier circuit $SAI_0$ includes a pair of cross-coupled transistors; however, to distinguish these from the prior art pair discussed earlier, in FIG. 4 the transistors are labeled T4 and T5. As in the prior art, by cross-coupled it is meant that the drain of each transistor, which is connected to receive a corresponding signal from either conductor $C_{0a}$ or $C_{0b}$, is also connected to the gate of the opposing transistor in the pair. Moreover, the sources of T4 and T5 are connected to one another, and are further connected to the drain of an enable n-channel transistor; this enable n-channel transistor may be the same as in the prior art depiction of FIG. 1b and, thus, in FIG. 4 it is once again labeled T3. In addition, note two additional observations regarding T3 for this embodiment or an alternative embodiment. First, numerous amplifiers such as sense amplifier $SAI_0$ may share the same single transistor T3, that is, the tied source connections of transistors T4 and T5 may all be connected to the drain of a single transistor, T3. Second, while the body of transistor T3 is shown as connected to its source (and, hence, to ground), as an alternative it may be permitted to float or connected elsewhere. In any event, turning to its operation, if SENSE is asserted, enable transistor T3 conducts and connects the sources of transistors T4 and T5 to ground, thereby amplifying the differential signal along conductors $C0_a$ and $C0_b$, so the result and its complement may be read from outputs DOUT and $\overline{\text{DOUT}}$, respectively.

Turning now to a key distinction between sense amplifier circuit $SAI_0$ of FIG. 4 and its prior art counterpart described earlier, note that in the case of transistors T4 and T5, the body of each is not connected to its corresponding source. Instead, the bodies of transistors T4 and T5 are connected to one another, but not to a node (e.g., a transistor source or a fixed potential node) which has a fixed voltage associated with it. In other words, the bodies of transistors T4 and T5 are connected in such a manner that they float. Of course, since the two bodies are connected to one another, each generally stores the same voltage as the other, that is, they float together. As described later, there may be some delay between a voltage change at one body versus the voltage change at the other, but this effect is initially set aside in reviewing some observations about the operation arising from the jointly connected and floating bodies of transistors T4 and T5, as is done immediately below.

Given that the bodies of transistors T4 and T5 both float, initially it is noted that this is against the teachings of the prior art which tend toward connecting the bodies to a known voltage. However, note that the present inventive embodiment still provides effective operation in the context of the cross-coupling and differential amplification of a sense amplifier. Specifically, the purpose of transistors T4 and T5 is to amplify the differential signal provided between conductors $C0_a$ and $C0_b$. If the bodies of transistors T4 and T5 were permitted to float independently of one another, then the recent signal conditions as to one of these transistors may affect its threshold voltage in a manner which would create an imbalance as to the other transistor if it were not affected in the same way. However, in contrast, the tying of the bodies together as shown in FIG. 4 causes any signal condition effect on one transistor body to be imposed on the other transistor body as well. Thus, the two transistors remain generally balanced with respect to one another and, thus, properly perform the function of amplifying a differential signal. This latter statement may indeed also be true of the prior art, but note that the preferred embodiment achieves the same goal without having to further connect the bodies of each transistor to a known potential such as to the source. As shown below, in addition to achieving this goal, the preferred embodiment may have further benefits in contrast to the prior art, such as reducing device size and improving device speed.

Figure 5A:
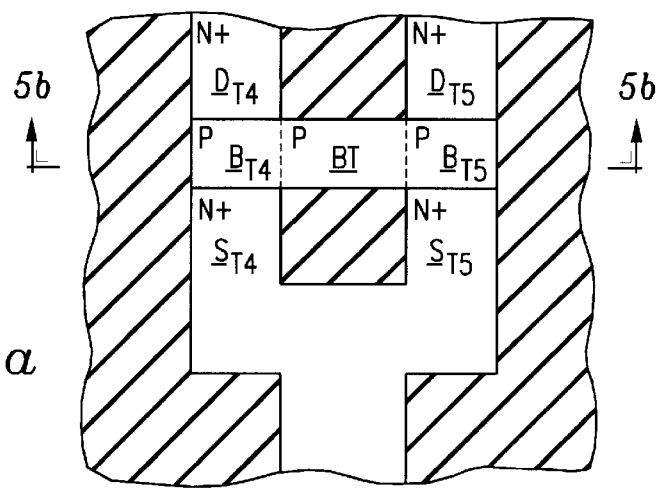
FIG. 5a illustrates a plan view of the semiconductor fabrication of a first embodiment of the cross-coupled transistors of FIG. 4 after the source, drain, and body regions are formed.
Figure 5B:
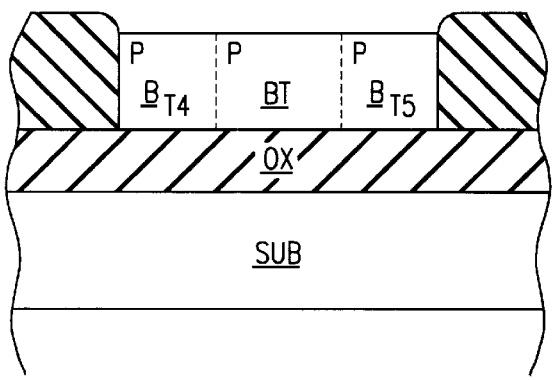
Figure 5C:
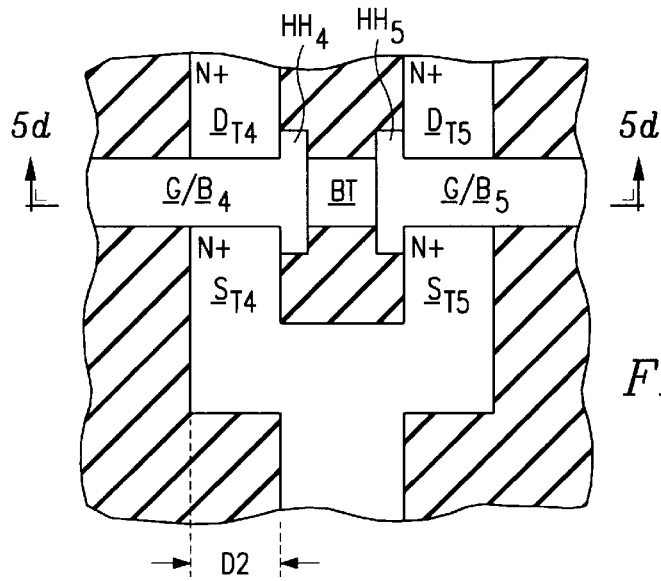
FIG. 5c illustrates a plan view of the semiconductor fabrication of the cross-coupled transistors of FIG. 5a after the gate regions are formed.
Figures 5D, 6B:
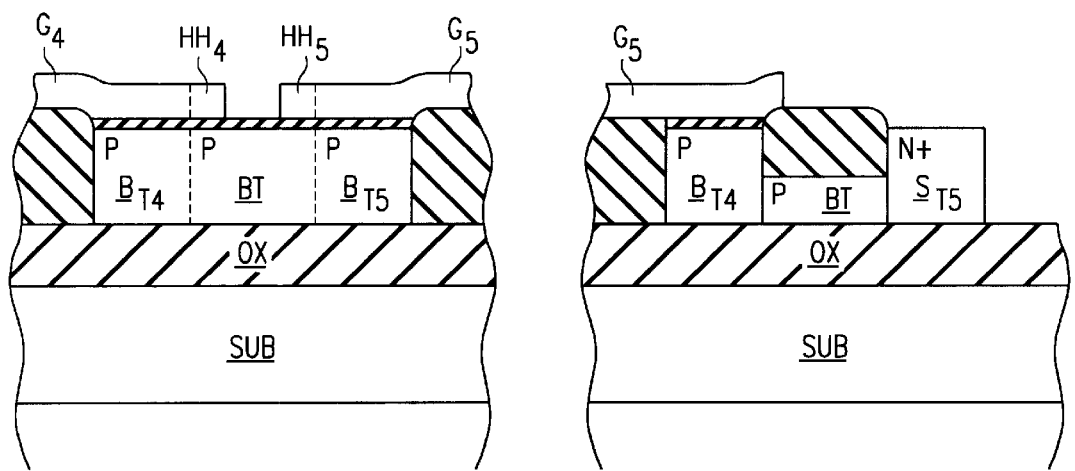

FIGS. 5a and 5c illustrate plan views of a first embodiment of the integrated circuit layout of the cross-coupled transistors T4 and T5 from FIG. 4, with FIG. 5a illustrating the circuit after the source, drain, and body regions are formed while FIG. 5c adds the formation of the gate regions thereto. Additionally, FIGS. 5b and 5d illustrate cross-sectional views along correspondingly indicated lines 5b—5b and 5d—5d of FIGS. 5a and 5c, respectively.

Looking to FIG. 5a, in the area of its the top left corner of the Figure is an N+ region which forms the drain $D_{T4}$ of transistor T4, and a P type semiconductor region which forms the body $B_{T4}$ of transistor T4 and separates drain $D_{T4}$ from source $S_{T4}$ of transistor T4. Similarly to the right of FIG. 5a, there is an N+ region which forms the drain $D_{T5}$ of transistor T5, and a P type semiconductor region which forms the body $B_{T5}$ of transistor T5 and separates drain $D_{T5}$ from source $S_{T5}$ of transistor T5. Recall from FIG. 4 that, in the preferred embodiment, the bodies of transistors T4 and T5 are electrically connected to one another. In this regard, note further that the semiconductor layer shown in FIG. 5a further includes a body tie region BT, also formed as a P type semiconductor region. Thus, one skilled in the art will appreciate that body tie BT provides an electrical connection between bodies $B_{T4}$ and $B_{T5}$ of transistors T4 and T5, respectively. Lastly, note that the remaining illustrated area of FIG. 5a is shown with a thick cross-hatching to indicate an isolation technique using an insulator, typically formed as an oxide.

Looking to FIG. 5b, it also illustrates bodies $BT_4$ and $BT_5$ of transistors T4 and T5, respectively. Additionally, FIG. 5b demonstrates the formation of body tie BT between transistor bodies $BT_4$ and $BT_5$. From the perspective of FIG. 5b, note further that in this embodiment the height of the device layer which forms bodies $BT_4$ and $BT_5$ as well as body tie BT is uniform. In other words, each of these device parts extend the same distance perpendicular to the surfaces of the oxide layer OX and substrate SUB formed below them. Additionally, in the present embodiment, note that this same height is also the height of the source and drain regions of transistors T4 and T5. This height feature is noted as it differs from alternative embodiments which are also within the inventive scope and are detailed later.

Looking to FIG. 5c, gate conductors $G/B_4$ and $G/B_5$ are shown as formed overlying bodies $B_{T4}$ and $B_{T5}$, respectively. As in the case of FIG. 3a, in FIG. 5c a combined designator of G/B is used for each transistor to indicate that only the gate is shown from the perspective of the Figure, but as further shown in FIG. 5d the body of the transistor is under each corresponding gate conductor. Indeed, in this regard, note further in FIG. 5d that the "G" and "B" designators are separated for the gate and body regions, respectively, since these regions are separately perceptible in a cross-sectional view. Returning to FIG. 5c, $G/B_4$ indicates the gate conductor of transistor T4, with it understood that body $B_{T4}$ underlies that gate conductor (and is further separated by a gate insulator which is shown in FIG. 5d). Similarly, $G/B_5$ indicates the gate conductor of transistor T5, with it understood that body $B_{T5}$ underlies that gate conductor (again as further separated by a gate insulator shown in FIG. 5d). Note further in the preferred embodiment that the gate conductors for transistors T4 and T5 are formed of a shape to include a hammerhead region $HH_4$ and $HH_5$, respectively. Each hammerhead region, therefore, includes extensions protruding in a direction perpendicular to the length of the underlying body tie BT. Note that the hammerhead regions are preferably included to avoid a possible problem if some misalignment were to occur between a gate conductor and a portion of body tie BT. In other words, if a gate conductor did not include a hammerhead region and were not to completely cover the underlying body tie BT due to misalignment, then a subsequently formed metal layer (e.g., a silicide over the gate conductors as well as over the source and drain regions) may otherwise create a short circuit between the body tie and one of the sources or drains of transistor T4 or transistor T5. However, the perpendicular extensions of each gate conductor ensure that the underlying body tie BT is covered in the vicinity of the source or drain of each transistor, and thus precludes the formation of such a short circuit metal region. Lastly, note that the use of hammerhead regions $HH_4$ and $HH_5$ as shown above may be optional depending on various factors, including layer alignment, formation of gate sidewalls of a sufficient width, elimination of silicides, and the width of body tie BT.

Having demonstrated a preferred layout of the cross-coupled configuration of transistors T4 and T5, one skilled in the art may further appreciate how the lack of a source-to-body connection by the preferred embodiment may reduce the overall size of sense amplifier circuit. Specifically, recall earlier in connection with FIG. 3a it was shown how each body contact $BC_1$ or $BC_2$ adds to the overall width of the semiconductor region associated with the source area of each of prior art transistors T1 and T2. In other words, it was shown that this overall width is of a size equal to D1+D2. In contrast, note from FIG. 5c that without the need for such a body contact, the width of D1 is eliminated and therefore the comparable N+ regions of transistors T4 and T5 are only a width equal to D2. Thus, the overall width of the cross-coupled transistor configuration is reduced. Moreover, when the cross-coupled transistors of the preferred embodiment are implemented in a memory configuration such as is shown in FIG. 1, there is likely to be a fairly large number of sense amplifier circuits with each having a width smaller than that of the prior art. Consequently, the reduced size of each individual sense amplifier circuit accumulates with each of the other like circuits to provide a greater overall size reduction for the memory configuration as a whole.

Figure 6A:
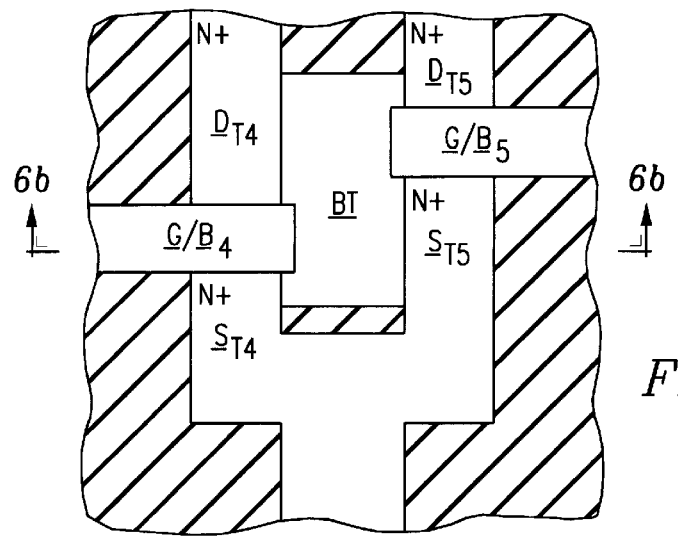
FIG. 6a illustrates a plan view of the semiconductor fabrication of a second embodiment of the cross-coupled transistors of FIG. 4 after the source, drain, body, and gate regions are formed.

FIG. 6a illustrates a plan view of an alternative construction of the integrated circuit layout of the cross-coupled transistors T4 and T5 from FIG. 4 after the source, drain, body, and gate regions are formed. Additionally, FIG. 6b illustrates a cross-sectional view along line 6b—6b of FIG. 6a. The embodiment of FIGS. 6a–b differs from that of FIGS. 5a–d generally in three respects, and is included to demonstrate that different layout considerations may be achieved while staying within the inventive scope. Each of these aspects is discussed separately below, but one skilled in the art should appreciate that each may be accomplished either alone or in combination with the other aspects, and may be combined further with other aspects taught in this document to achieve still additional alternative embodiments.

As a first difference in embodiments of FIGS. 5a–d and 6a–b, note that gate conductors G/B$_4$ and G/B$_5$ in FIG. 6a are not co-linear as is the case for the embodiment of FIGS. 5a–d. Indeed, note that where the present invention is implemented for a digital memory, space requirements may often dictate that the layout be sacrificed in either the x- or y-dimension in order to comply with the pitch requirements which are dictated by the layout of the memory cells used in the digital memory. Thus, the embodiment of FIGS. 6a and 6b demonstrates how space requirements may be re-arranged by re-orienting the gates of the cross-coupled transistors with respect to one another.

As a second difference in the embodiments of FIGS. 5a–d and 6a–b, note how body tie BT differs as between the different Figures. This difference is further achieved in two respects. First, as evident from the cross-sectional view of FIG. 6b, note that body tie BT does not extend to the same height as the remaining device layer regions of transistors T4 and T5. In other words, recall from FIG. 5b that the earlier embodiment included a body tie which extended a height, as defined in the dimension perpendicular to the surfaces of oxide layer OX and substrate SUB, equal to the height of bodies B$_4$ and B$_5$ (as well as the height of the source and drain regions of transistors T4 and T5). In contrast, in the embodiment of FIGS. 6a–b the height of body tie BT is reduced. In this regard, note that this reduced height technique may be achieved as has been done by IBM in devices where a reduced height structure joins the bodies of many or all SOI transistors in an area on an integrated circuit analogous to a well structure in bulk. Such well-like structures in SOI generally incur increased capacitance and increased junction leakage, as well as otherwise restricting the layout of the transistors. In contrast, in the present embodiment, it is contemplated that only the bodies of transistors T4 and T5 are connected in this manner. Moreover, and importantly, the techniques used by IBM and Mitsubishi further require that this mutual body connection is further connected to a known potential; in stark contrast, the body connection of transistors T4 and T5 is only to one another, and thus the bodies are otherwise permitted to float. As a second distinction in the body ties between the embodiments of FIGS. 5a–d and 6a–b, note that body tie BT in FIGS. 6a–b spans a larger area over the buried oxide. This distinction arises due to the non-alignment of the bodies of transistors T4 and T5. In other words, if the reduced height approach were used in the embodiment of FIGS. 5a–5d, the body tie may cover only the same area as shown in those Figures. However, since the central axis of G/B$_4$ is not aligned with the central axis of G/B$_5$, then body tie BT of FIGS. 6a–b also must extend to cover a larger area.

As a third difference in embodiments of FIGS. 5a–d and 6a–b, note that the gate conductors in FIG. 6a do not include hammerhead regions as does the embodiment of FIGS. 5c–d. As mentioned above, various considerations may render the hammerhead regions optional, and FIGS. 6a–b present an embodiment where they are indeed unnecessary. Specifically, note from the cross-sectional perspective of FIG. 6b that body tie BT, given its reduced height, is covered by an insulating oxide region (where this oxide region is not shown in FIG. 6a). Thus, even if a silicide layer were subsequently created over the device, this insulating oxide region would prevent any short circuit from being formed between body tie BT and any of the source or drain regions of either transistor T4 or T5. Accordingly, there is no additional need for the functionality provided by hammerhead regions HH$_4$ and HH$_5$ in the embodiment of FIGS. 5c–d.

Figure 7A:
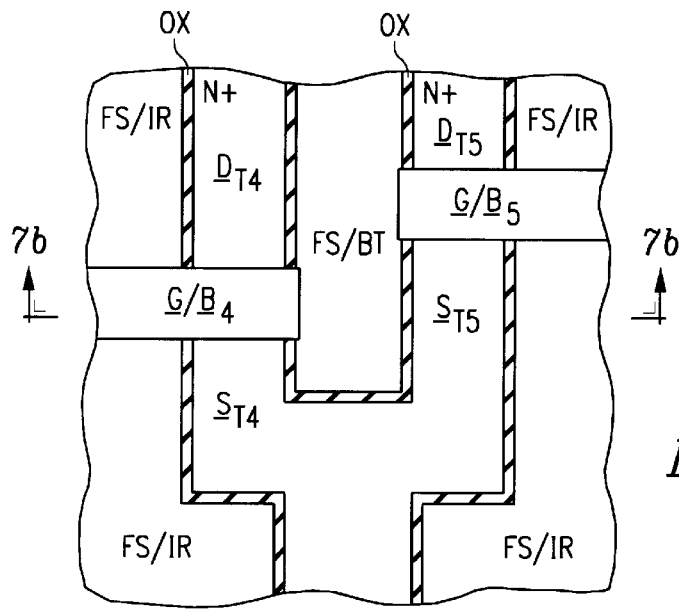
FIG. 7a illustrates a plan view of the semiconductor fabrication of a second embodiment of the cross-coupled transistors of FIG. 4 after the source, drain, body, and gate regions are formed.
Figure 7B:
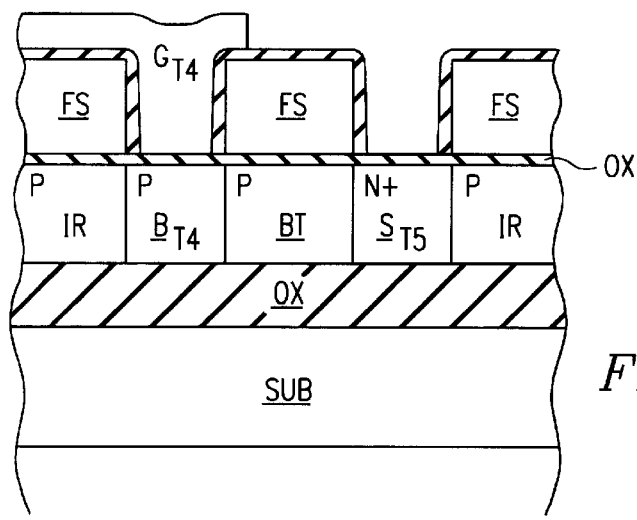

FIG. 7a illustrates a plan view of yet another alternative construction of the integrated circuit layout of the cross-coupled transistors T4 and T5 from FIG. 4 after the source, drain, body, and gate regions are formed. Additionally, FIG. 7b illustrates a cross-sectional view along line 7b—7b of FIG. 7a. The embodiment of FIGS. 7a–b differs from the earlier embodiments in that the present configuration implements so-called field shielding technology. Such technology provides an alternative to using only field insulators (e.g., oxides) to isolate various device regions. Specifically, with reference to FIG. 7a, note that the areas which do not form either a transistor source or drain are designated FS/IR. This designation is intended to depict that the area includes a field shield (hence, "FS") overlying an insulating region (hence, "IR"), as further appreciated below.

The field shields and insulating regions are further apparent from the cross-sectional perspective of FIG. 7b. In that figure, note first along the device layer that any region which is neither a transistor source nor a transistor drain is of a like conductivity type (P type in the example of FIG. 7b). These like conductivity type regions are the insulating regions and, thus, are designated IR in FIG. 7b. Moreover, note that one of the insulating regions may be used as a body tie BT and, accordingly, is labeled as such in FIG. 7b. As with earlier embodiments, body tie BT connects the bodies of transistors T4 and T5. Of course, while not visible from the perspective of FIGS. 7a–b, it should be understood that this connecting region is further isolated from other insulating regions so that body tie BT, as well as the bodies of transistors T4 and T5, are electrically floating. Above each of the insulating regions, and separated therefrom by an insulating oxide, is a corresponding semiconductor region known in the art as a field shield; thus, the field shields are designated FS in FIG. 7b. In the preferred embodiment, each field shield is connected to ground, thereby providing an isolation capability as between other semiconductor regions which form the overall circuit configuration. Lastly, while FIGS. 7a–b contemplate implementing the present embodiments using a shield fielding technique, note that such an approach may not be preferred as it may tend to complicate various design and manufacturing considerations.

Having described spatial improvements provided by the preferred embodiments, various electrical improvements may arise from the preceding embodiments as well. These improvements ultimately manifest themselves as faster operation of each sense amplifier circuit. If such a result is reached, then the data sensed by these circuits is more quickly available from the memory configuration implementing the present embodiment. Consequently, that data may be used either within or external from the integrated circuit, thereby improving performance as compared to the prior art. In this regard, two different bases exist which may explain such improved performance and, thus, each is separately discussed below.

Figure 8:
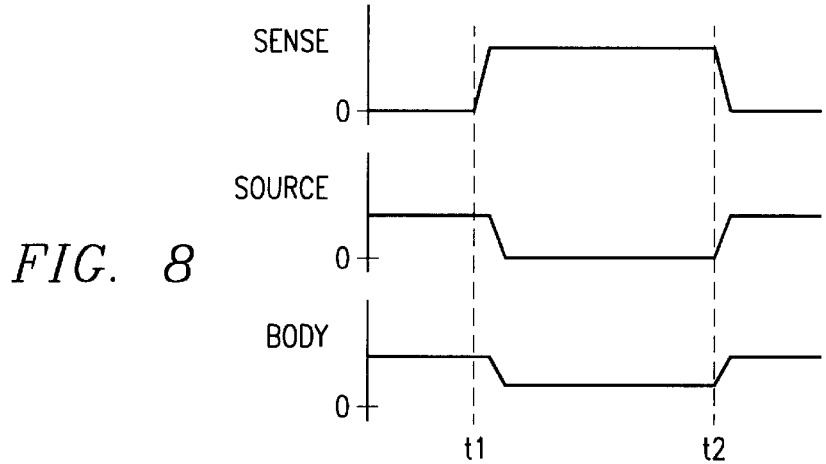
FIG. 8 illustrates a timing diagram of the operation of the sense amplifier circuit of FIG. 4 as directed to the effect of capacitive coupling between the transistor source and the transistor body.

As a first observation regarding the electrical performance of the preferred embodiment, FIG. 8 depicts a timing diagram which illustrates three signals to further demonstrate an effect of the capacitive coupling as illustrated earlier in connection with FIGS. 2a and 2b. At a time t1, the SENSE signal is asserted as shown in the top signal in FIG. 8. After some short delay, one skilled in the art will appreciate from FIG. 4 that the sources of transistors T4 and T5 are pulled to ground via transistor T3, and as is shown in the middle signal in FIG. 8. Due to the capacitance and diode effects between the body and the source, this operation also causes the body to be pulled in the direction of ground, but it will initially be pulled to some voltage slightly larger than zero (e.g., 0.6 volts) as shown at the bottom of FIG. 8. Note further, therefore, that the non-zero body voltage reduces the threshold voltage for the corresponding transistor. Thus, a lower threshold voltage corresponds to a larger drive current for the device and, hence, faster operation thereof.

As a second observation regarding the electrical performance of the preferred embodiment, recall that it was noted above that there may be some delay between a voltage change at one body versus the voltage change at the other for the connected bodies of transistors T4 and T5. Specifically, from the use of body tie BT as shown in FIGS. 5$a$ and 5$c$, note that this semiconductor region has both resistive and capacitive characteristics. Consequently, when the voltage changes first on one body then there will be some slight delay before that change is also manifested on the other body of the cross-connected transistor pair. It is believed that this delay actually serves to increase the speed of the device when combined with the result of the floating body connection. This result is understandable by returning to FIG. 4 and by way of example. For the example, assume initially that the voltages at conductors $C_{0a}$ and $C_{0b}$ are equal and that the voltages at the bodies of transistors T4 and T5 are also equal. Next, assume a differential voltage is established between conductors $C_{0a}$ and $C_{0b}$ such that conductor $C_{0a}$ is at a higher voltage than conductor $C_{0b}$. The capacitive coupling between the gate and body of each of transistors T4 and T5 will therefore initially cause a differential voltage between the bodies of transistors T4 and T5 such that the threshold voltage of transistor T4 will be higher than the threshold voltage of transistor T5. This differential voltage thereafter will be equalized by body tie BT, but only after some RC delay. Consequently, if sense amplifier $SAI_0$ is enabled while the differential in threshold voltages exists, the action of sense amplifier $SAI_0$ is enhanced. Additionally, the effective capacitance on the gate is reduced by the response of the body voltage. This would not be the case if the body voltages of transistors T4 and T5 were held rigidly at the same potential. Thus, the performance of the sense amplifier circuit is improved by incorporating some delay in the equalization of the two body voltages. Given these observations, the resistance of body tie BT may be chosen to optimize the trade-off between the advantages of floating bodies and the disadvantages of imbalanced threshold voltages for a sense amplifier circuit. In this regard, in one embodiment, the preferred time constant for equalization of the two body potentials is approximately equal to the time period between consecutive accesses of the sense amplifier circuit. Thus, for a synchronous access, the time period is equal to one clock cycle, and for an asynchronous access, the time period is preferably equal to the minimum anticipated time between consecutive accesses.

Figure 9:
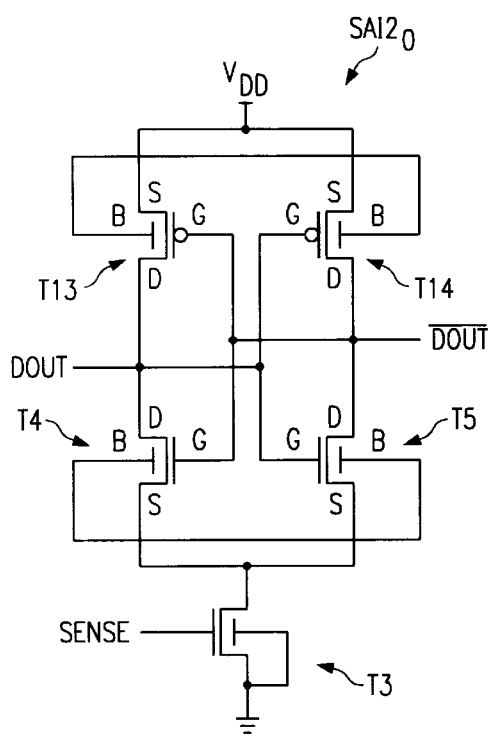
FIG. 9 illustrates a schematic of an alternative sense amplifier circuit in accordance with the present inventive embodiments.

FIG. 9 illustrates a schematic of a sense amplifier $SAI2_0$ as an alternative embodiment in accordance with the present inventive embodiments and, thus, once again as a substitute for sense amplifier $SA_0$ as shown in FIG. 1$b$. In various respects, sense amplifier $SAI2_0$ has features in common with sense amplifier $SAI_0$ of FIG. 4; for this reason, where like features exist the same reference identifiers are carried forward from FIG. 4 to FIG. 9. More specifically in this regard, note that sense amplifier $SAI2_0$ includes transistors T3, T4, and T5 connected with respect to one another in the same fashion as sense amplifier $SAI_0$. In addition, however, transistors T4 and T5 are further connected to newly added p-channel transistors T13 and T14 as follows. The sources of transistors T13 and T14 are connected to $V_{DD}$. The drain of transistor T13 is connected to the drain of transistor T4, while the drain of transistor T14 is connected to the drain of transistor T5. Additionally, the gate of transistor T13 is connected to the gate of transistor T4, and the gate of transistor T14 is connected to the gate of transistor T5. These additional gate connections, therefore, also connect the gate of transistor T13 to the $\overline{DOUT}$ output and the gate of transistor T14 to the DOUT output Lastly, note that the body of transistor T13 is connected to the body of transistor T14, but these connected bodies are not further connected to any fixed potential and, thus, are connected to float together. Also in this regard, note that while this body-to-body connection is shown in addition to the body-to-body connection between transistors T4 and T5, each such connection may be implemented independent of one another. Thus, in an alternative embodiment, while the bodies of transistors T4 and T5 are connected to float together, the bodies of transistors T13 and T14 could be connected in a different manner such that those bodies did not float together. As yet another alternative, the opposite is also true whereby the bodies of transistors T13 and T14 are connected to float together, but the bodies of transistors T14 and T5 could be connected in a different manner such that those bodies did not float together.

The operation of sense amplifier $SAI2_0$ is similar to that of sense amplifier $SAI_0$ and, thus, the reader is referred to the earlier discussion of the operation of sense amplifier $SAI_0$ for introductory detail. In addition, however, note that the inclusion of p-channel transistors T13 and T14 provide a supplemental benefit in the case of possible small signal differentials imposed on sense amplifier $SA2I_0$. Specifically, assume by way of example that at the time SENSE is asserted, the voltage at DOUT is only marginally greater than that at $\overline{DOUT}$. Without the added benefit of transistors T13 and T14, it may then be the case that the intended effect of driving transistor T5 on and transistor T4 off is slowed down or otherwise disturbed. However, in the present example, the relatively lower potential at $\overline{DOUT}$ also operates to enable transistor T13, which further assists in ensuring that node DOUT remains high, thereby providing a more reliable and robust amplified signal in certain contexts. In addition to this operation, note again that the floating body connections of transistors T4 and T5 are the same as detailed earlier in connection with sense amplifier $SAI_0$, and that discussion now also applies to the floating body connections of transistors T13 and T14.

Figure 10:
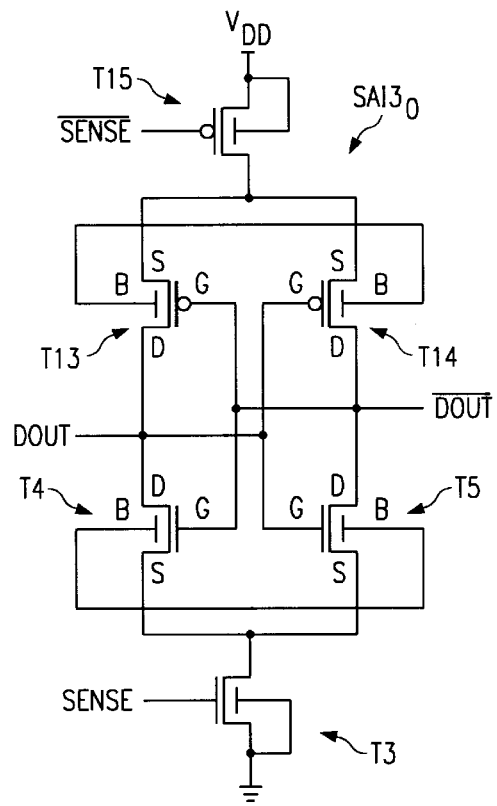
FIG. 10 illustrates a schematic of yet another alternative sense amplifier circuit in accordance with the present inventive embodiments.

FIG. 10 illustrates a schematic of a sense amplifier $SAI3_0$ as yet another alternative embodiment in accordance with the present inventive embodiments. Once more, therefore, this alternative may be substituted for sense amplifier $SA_0$ as shown in FIG. 1$b$. In virtually all respects, sense amplifier $SAI3_0$ shares the same features as sense amplifier $SAI2_0$ of FIG. 9 and, thus, once again like reference identifiers are carried forward from FIG. 9 to FIG. 10. From a connection standpoint, the sole difference between sense amplifier $SAI3_0$ and sense amplifier $SAI2_0$ is that sense amplifier $SAI3_0$ includes an additional p-channel transistor T15 connected between $V_{DD}$ and the tied sources of transistors T13 and T14. More specifically, the source of transistor T15 is connected to $V_{DD}$, the drain of transistor T15 is connected to the sources of transistors T13 and T14, the gate of transistor T15 is connected to receive the complement of the SENSE signal (shown as $\overline{SENSE}$ in FIG. 10), and the body of transistor T15 is also connected to $V_{DD}$. Lastly, like T3 as pointed out in connection with $SAI_0$ of FIG. 4, note with respect to transistor T15 that for this embodiment or an alternative embodiment, numerous sense amplifiers may share the same single transistor T15, and while the body of transistor T3 is shown as connected to its source (and, hence, to $V_{DD}$), as an alternative it may be permitted to float or connected elsewhere.

The operation of sense amplifier $SAI3_0$ is similar to that of sense amplifier $SAI2_0$ and, thus, the reader is referred to the previous discussion of the operation of sense amplifier $SAI2_0$ for more detail. In addition, however, note that the inclusion of p-channel transistor T15 provides an additional benefit in a context, such as may be the case in a dynamic random access memory (DRAM), where at initialization the signal differential imposed on DOUT and $\overline{DOUT}$ is in the middle of the voltage range between $V_{DD}$ and ground, or again where the differential voltage between DOUT and $\overline{DOUT}$ is relatively small. To appreciate this point, first consider the previous sense amplifier $SAI2_0$ in the case when there is capacitive mismatch between nodes DOUT and $\overline{DOUT}$ of the circuit, where such mismatch could arise from various factors in the manufacturing process. In this case, when SENSE is asserted there is initially a common mode signal as both DOUT and $\overline{DOUT}$ at first are pulled down and only thereafter will the voltage at one of those nodes start to rise and diverge from the other. In contrast, however, looking to sense amplifier $SAI3_0$ when SENSE is asserted, both transistors T3 and T15 conduct and, thus, there is substantially the same amount of drive current being pulled in opposite directions by each of those transistors. As a result, if there is any capacitive mismatch between the other transistors of the circuit, then the equalized current pull from transistors T3 and T15 tends to reduce or eliminate the common mode signal, thereby improving the amplifier's ability to amplify either a small differential signal or voltages at DOUT and $\overline{DOUT}$ which are initialized somewhere between $V_{DD}$ and ground.

Having now presented numerous embodiments in the context of a digital memory, note that, and as mentioned at the outset of this Detailed Description Of The Invention section, the present inventive embodiments include other types of differential amplifier transistor circuits constructed using SOI technology. Such embodiments may extend to circumstances other than the sense amplifier which is a differential amplifier used in digital memories. In this regard, below are presented still additional embodiments which typically arise in analog circuits rather than digital circuits. Consequently, one skilled in the art will appreciate from the following how the inventive scope further extends to such applications and still others given the teachings of this document and the skill in the art.

Figure 11:
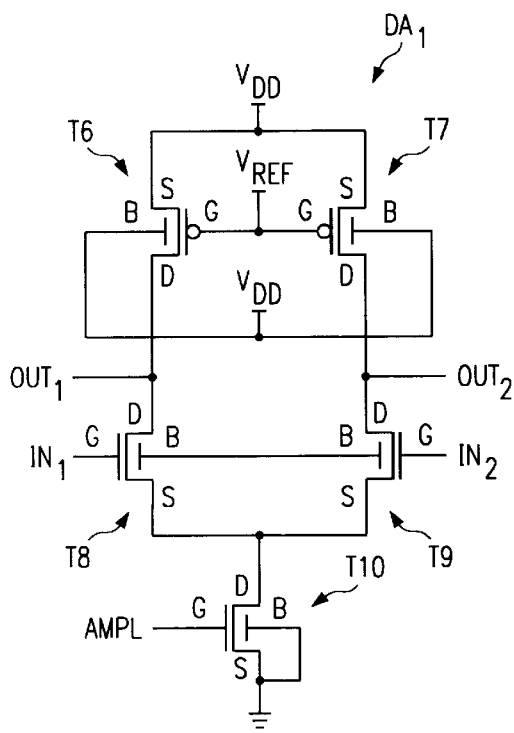
FIG. 11 illustrates a schematic of an alternative differential amplifier circuit in accordance with the present inventive embodiments.

FIG. 11 illustrates a schematic of a differential amplifier $DA_1$ further in accordance with the present inventive embodiments. Differential amplifier DA1 generally includes five transistors indicated generally as T6 through T10, the connections of which are first described below followed by a brief description of the circuit operation. Starting toward the top of FIG. 11, differential amplifier $DA_1$ includes two p-channel transistors T6 and T7. The sources of each of transistors T6 and T7 are connected to receive a bias voltage, represented in FIG. 11 as $V_{DD}$. The gates of transistors T6 and T7 are connected to receive a reference voltage, designated $V_{REF}$, which is at some level between ground and $V_{DD}$. The bodies of transistors T6 and T7 are connected to one another, and further connected to a fixed voltage which in the example of FIG. 11 is $V_{DD}$. Lastly, the drains of transistors T6 and T7 are connected to provide differential output signals shown as $OUT_1$ and $OUT_2$, respectively. Differential amplifier $DA_1$ further includes two n-channel transistors T8 and T9. The drains of transistors T8 and T9 and connected to the drains of transistors T6 and T7, respectively. The sources of transistors T8 and T9 are connected to one another, and further to the drain of an n-channel transistor T10. The gates of transistors T8 and T9 are connected to receive corresponding differential inputs signals $IN_1$ and $IN_2$, respectively. Lastly with respect to transistors T8 and T9, and importantly, note that their bodies are connected to one another, but otherwise are connected to float in that they are not tied to any fixed potential. Completing the circuitry of differential amplifier $DA_1$, the source and body of transistor T10 is connected to ground. Lastly, the gate of transistor T10 is connected to receive an amplify signal abbreviated in FIG. 11 as AMPL.

The operation of differential amplifier $DA_1$ is as follows. Differential input signals $IN_1$ and $IN_2$ are applied to the gates of transistors T8 and T9, respectively. Moreover, typically differential amplifier $DA_1$ is used in an analog circuit and, thus, its functionality is continuous rather than being turned on and off as would be the anticipated operation in a digital context. In the regard of continuous operation, AMPL is constantly enabling to transistor T10, that is, it is set at a sufficient potential to cause transistor T10 to conduct. Since transistor T10 conducts, then the sources of transistors T8 and T9 are connected to ground and, thus, those two n-channel transistors also conduct. In addition, transistors T6 and T7 operate to source current through these conducting transistors and, hence, amplify the differential signal between $IN_1$ and $IN_2$. Consequently, the amplified differential signal is output between signals $OUT_1$ and $OUT_2$ for use by other circuitry.

Having described the construction and operation of differential amplifier $DA_1$, note now some observations regarding the tied floating body connection of transistors T8 and T9. Specifically, as in the case of earlier-described embodiments, these two transistors serve to receive differential signals. Thus, it is desirable that the bodies of each are at the same potential. However, rather than fixing this potential, as also in the case of earlier-described embodiments, the tied bodies are connected to float. As a result, any effect on the body of one transistor in the transistor pair, where that effect may occur because the body is floating, is further realized at the body of the other transistor in the transistor pair. In other words, there is a balancing of the effect on both transistors. Moreover, because the transistors are operating on a differential input signal, this balancing effect does not negatively impact the differential operation and, thus, appropriate differential output signals are achieved without having to tie the transistor bodies to a fixed potential.

Figure 12:
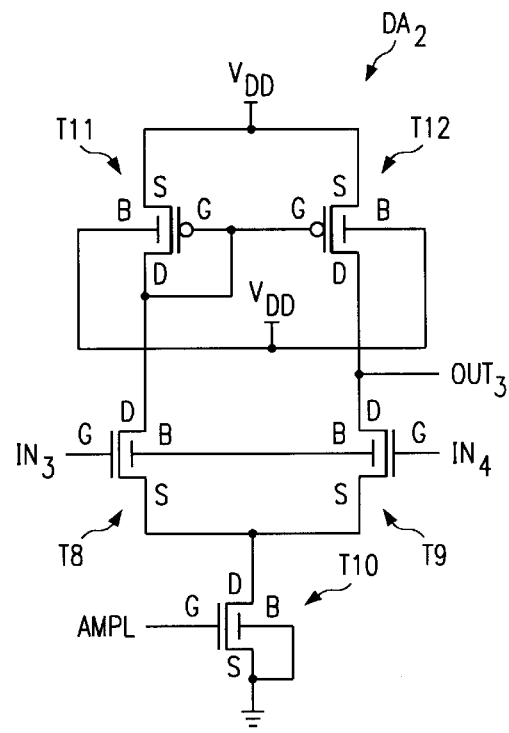
FIG. 12 illustrates a schematic of yet another alternative differential amplifier circuit in accordance with the present inventive embodiments.

FIG. 12 illustrates a schematic of a differential amplifier $DA_2$ which has some features in common with differential amplifier $DA_1$ of FIG. 11; for this reason, where like features exist the same reference identifiers are carried forward from FIG. 11 to FIG. 12. However, for purposes of later discussion, various other reference identifiers are changed which will be appreciated from the following. Differential amplifier $DA_2$ generally includes five transistors indicated generally as T8 through T12, the connections of which are first described below followed by a brief description of the circuit operation. Starting toward the top of FIG. 12, differential amplifier $DA_2$ includes two p-channel transistors T11 and T12. The sources of each of transistors T11 and T12 are connected to receive $V_{DD}$. The gates of transistors T11 and T12 are connected to the drain of transistor T11. The bodies of transistors T11 and T12 are connected to one another, and further connected to a fixed voltage which in the example of FIG. 12 is $V_{DD}$. Lastly, the drain of transistor T12 provides an amplified output signal shown as $OUT_3$. Differential amplifier $DA_2$ further includes two n-channel transistors connected in the same manner as the correspondingly shown n-channel transistors in FIG. 11; thus, again in FIG. 12 these transistors are shown as T8 and T9 and, thus, have bodies which are connected to one another and connected to float. Due to the likeness in connections, the reader is referred to the earlier discussion of transistors T8 and T9, as well as to transistor T10 which also is an n-channel transistor connected in the same manner as the case of transistor T10 shown and described with respect to FIG. 11, above. To distinguish the following operational discussion, however, note that the differential input signals to the gates of transistors T8 and T9 in FIG. 12 are shown as $IN_3$ and $IN_4$, respectively.

The operation of differential amplifier $DA_2$ is similar to that of differential amplifier $DA_1$, but results in a single output rather than differential output signals. Particularly, differential input signals $IN_3$ and $IN_4$ are applied to the gates of transistors T8 and T9, respectively. Once more, typically differential amplifier $DA_2$ is used in an analog circuit and, thus, AMPL is constantly enabling to transistor T10 to cause it to conduct. Since transistor T10 conducts, then transistors T8 and T9 also conduct. Moreover, transistors T11 and T12 operate as a current mirror and provide current through conducting transistors T8 and T9. Thus, the differential signal between $IN_3$ and $IN_4$ is amplified, and the resulting amplified signal is output as signal $OUT_3$ for use by other circuitry. Consequently, one skilled in the art will appreciate that differential amplifier $DA_2$, like differential amplifier $DA_1$, again operates in an appropriate manner to amplify a differential input signal using an SOI transistor pair having bodies connected to one another and connected to float.

Having reviewed the many embodiments presented above, one skilled in the art should appreciate that FIGS. 4 through 10 demonstrate embodiments which may be used in digital circuits, while FIGS. 11 and 12 illustrate embodiments more favorable to analog circuits. In this regard, however, note that the use of the present teachings in digital circuits, and particularly where the circuit is repeated numerous times on a single integrated circuit (e.g., sense amplifiers on a digital memory), may be more advantageous for various reasons. For example, in the digital context, the improved speed of operation may be more beneficial as opposed to an analog application where the amplifier is continuously operating. As another example, a digital circuit application is likely to have more critical size constraints and, therefore benefit more from a design with reduced spatial requirements. As still another example, when the circuit is required to be repeated numerous times such as for the sense amplifier in the digital memory, recall that the benefit as realized by each individual sense amplifier circuit accumulates with each of the other like circuits to provide a greater overall size reduction for the memory configuration as a whole.

As another point of contrast between the embodiments of FIGS. 4 through 10 and the embodiments of FIGS. 11 and 12, note that the former use the transistor drains and gates as the inputs for the differential signal at issue while the latter use the transistor gates as the inputs for the differential signal. Moreover, the former implements cross-coupled gates while the latter does not. Thus, the present inventive scope contemplates different types of transistor configurations, where one of the mutual notions is that a pair of SOI transistors performs a differential signal amplification, where the same node for each transistor in the transistor pair receives a corresponding one of the two differential input signals. For example, for the embodiments of FIGS. 4 through 10, it is the drains of each transistor in the transistor pair which receives a corresponding one of the two differential input signals. Also by way of example, for the embodiments of FIGS. 11 and 12, it is the gates of each transistor in the transistor pair which receives a corresponding one of the two differential input signals. In any event, and in still other configurations which are ascertainable by one skilled in the art, also mutual to the present teachings and such other configurations is that the bodies of the paired transistors are connected to one another and further connected to float.

From the above, it may be appreciated that the above embodiments provide an improved differential amplifier configuration over the prior art. Additionally, while the present embodiments have been described in detail, various substitutions, modifications or alterations could be made to the descriptions set forth above without departing from the inventive scope. Some of these examples are discussed above, while still others will be ascertainable by one skilled in the art. Indeed, as a few examples, note that the conductivity types of the transistors described herein may be reversed; for example, the cross-coupled transistor pairs of FIGS. 4 though 8 may be implemented as p-channel transistors, although n-channel transistors are likely preferred due to an anticipated faster speed of operation. For either case (i.e., either the n-channel transistor or the p-channel transistor), note that each device has two regions which may be characterized as source/drain regions, with a body interposed between those regions, and thus the present embodiment may be implemented by tying together the bodies of the transistors and otherwise connecting the source/drain regions in a manner to accomplish a cross-coupled amplifier circuit. As another example, while the embodiments of FIGS. 5a through 7b illustrate various types of layouts for connecting the bodies of the cross-connected transistors, other layouts also may be used to achieve cross-coupled transistors with tied and floating bodies. As still another alternative, while the cross-coupled sense amplifier circuits shown above include only three transistors, various other circuits may be implemented where the cross-coupled pair is included in a more complex circuit or one having the common sources of the transistors connected to something other than the drain of a single n-channel transistor. As still another example, while FIG. 1 illustrates only a single memory bank, the teachings of this document may apply to other multiple or alternative memory configurations as well as to non-memory applications. Thus, these examples as well as the preceding teachings further demonstrate the flexibility and considerations of the inventive scope, as defined by the following claims.

We claim:

1. An integrated circuit, comprising:
   a first SOI transistor comprising a plurality of nodes, the plurality of nodes comprising a first source/drain, a second source/drain, a gate for receiving a potential to enable a conductive path between the first source/drain and the second source/drain, and a body terminal coupled to a body region disposed between the first source/drain and the second source/drain;
   a second SOI transistor comprising a plurality of nodes, the plurality of nodes comprising a first source/drain, a second source/drain, a gate for receiving a potential to enable a conductive path between the first source/drain and the second source/drain, and a body terminal coupled to a body region disposed between the first source/drain and the second source/drain;

wherein one of the plurality of nodes of the first SOI transistor is connected to receive a first differential input signal;

wherein a same one of the plurality of nodes of the second SOI transistor is connected to receive a second differential input signal; and wherein the body of the first SOI transistor is connected to the body of the second SOI transistor and the bodies of the first and second SOI transistors are connected to float.

2. The integrated circuit of claim 1:

wherein the first SOI transistor and the second SOI transistor form a sense amplifier in a memory configuration;

wherein the memory configuration comprises:
 a plurality of wordlines;
 a first columnar conductor for providing the first differential signal; and
 a second columnar conductor for providing the second differential, wherein a differential voltage between the first differential signal and the second differential signal is representative of a data state of a storage cell in the memory array located along one of the plurality of wordlines corresponding to the first and second columnar conductors;
 wherein the first source/drain of the first SOI transistor is connected to the gate of the second SOI transistor; and
 wherein the first source/drain of the second SOI transistor is connected to the gate of the first SOI transistor.

3. The integrated circuit of claim 2 wherein each of the first and second SOI transistors is an n-channel transistor.

4. The integrated circuit of claim 2 wherein each of the first and second SOI transistors is a p-channel transistor.

5. The integrated circuit of claim 2 wherein the sense amplifier comprises a first sense amplifier, and further comprising:
 a plurality of columnar conductors in addition to the first and second columnar conductors, wherein each pair of the plurality of columnar conductors provides a pair of corresponding signals, and wherein a differential voltage between the corresponding signals is representative of a data state of a storage cell in the memory array located along one of the plurality of wordlines and corresponding to the corresponding pair of columnar conductors;
 a plurality of sense amplifiers in addition to the first sense amplifier, wherein each of the plurality of sense amplifiers is coupled to a corresponding pair of the plurality of columnar conductors, and comprises:
  a first SOI transistor having a first source/drain, a second source/drain, a gate for receiving a potential to enable a conductive path between the first source/drain and the second source/drain, and a body terminal coupled to a body region disposed between the first source/ drain and the second source/ drain;
  a second SOI transistor having a first source/drain, a second source/drain, a gate for receiving a potential to enable a conductive path between the first source/drain and the second source/drain, and a body terminal coupled to a body region disposed between the first source/drain and the second source/drain;
  wherein the first source/drain of the first SOI transistor is connected to the gate of the second SOI transistor;
  wherein the first source/drain of the second SOI transistor is connected to the gate of the first SOI transistor;
  wherein the body of the first SOI transistor is connected to the body of the second SOI transistor and the bodies of the first and second SOI transistors are connected to float.

6. The integrated circuit of claim 5 wherein, for each of the plurality of sense amplifiers, each of the first and second SOI transistors is an n-channel transistor.

7. The integrated circuit of claim 5 wherein, for each of the plurality of sense amplifiers, each of the first and second SOI transistors is a p-channel transistor.

8. The integrated circuit of claim 5 wherein each data storage cell located along one of the plurality of wordlines and corresponding to a corresponding pair of columnar conductors is a dynamic random access memory storage cell.

9. The integrated circuit of claim 5 wherein each data storage cell located along one of the plurality of wordlines and corresponding to a corresponding pair of columnar conductors is a static random access memory storage cell.

10. The integrated circuit of claim 2 wherein the data storage cell is a dynamic random access memory storage cell.

11. The integrated circuit of claim 2 wherein the data storage cell is a static random access memory storage cell.

12. The memory configuration of claim 2 wherein the second source/drain of the first SOI transistor is connected to the second source/drain of the second SOI transistor.

13. The integrated circuit of claim 2:
 wherein the second source/drain of the first SOI transistor is connected to the second source/drain of the second SOI transistor; and
 wherein the sense amplifier further comprises a third SOI transistor having a first source/drain connected to the second source/drain of the first SOI transistor and the second source/drain of the second SOI transistor, having a gate connected to receive an enable signal, and having a second source/drain connected to a fixed potential.

14. The integrated circuit of claim 2:
 wherein the second source/drain of the first SOI transistor is connected to the second source/drain of the second SOI transistor; and
 wherein the sense amplifier further comprises:
  a third SOI transistor having a first source/drain connected to the second source/drain of the first SOI transistor and the second source/drain of the second SOI transistor, having a gate connected to receive an enable signal, and having a second source/drain connected to a fixed potential;
  a fourth SOI transistor having a first source/drain connected to the first source/drain of the first SOI transistor, and having a gate connected to the gate of the first SOI transistor; and
  a fifth SOI transistor having a first source/drain connected to the first source/drain of the second SOI transistor, and having a gate connected to the gate of the second SOI transistor, and having a second source/drain connected to a second source/drain of the fourth SOI transistor.

15. The integrated circuit of claim 14 wherein the first and second SOI transistors are of a first conductivity type, and wherein the third and fourth SOI transistors are of a second conductivity type complementary of the first conductivity type.

16. The integrated circuit of claim 15:
wherein the fixed potential is a first fixed potential; and
wherein the second source/drain of each of the fourth and fifth SOI transistors is connected to a second fixed potential different than the first fixed potential.

17. The integrated circuit of claim 15:
wherein the fixed potential is a first fixed potential; and
further comprising a sixth SOI transistor having a first source/drain connected to the second source/drain of the fourth SOI transistor and the second source/drain of the fifth SOI transistor, having a gate connected to receive a complement of the enable signal, and having a second source/drain connected to a second fixed potential different than the first fixed potential.

18. The integrated circuit of claim 14:
wherein the fixed potential is a first fixed potential; and
wherein the second source/drain of each of the fourth and fifth SOI transistors is connected to a second fixed potential different than the first fixed potential.

19. The integrated circuit of claim 14:
wherein the fixed potential is a first fixed potential; and
further comprising a sixth SOI transistor having a first source/drain connected to the second source/drain of the fourth SOI transistor and the second source/drain of the fifth SOI transistor, having a gate connected to receive a complement of the enable signal, and having a second source/drain connected to a second fixed potential different than the first fixed potential.

20. The integrated circuit of claim 14:
wherein the fourth SOI transistor further has a body terminal coupled to a body region disposed between the first source/drain and the second source/drain of the fourth SOI transistor;
wherein the fifth SOI transistor further has a body terminal coupled to a body region disposed between the first source/drain and the second source/drain of the fifth SOI transistor; and
wherein the body of the fourth SOI transistor is connected to the body of the fifth SOI transistor and the bodies of the fourth and fifth SOI transistors are connected to float.

21. The integrated circuit of claim 1 wherein the integrated circuit is part of a stand alone memory integrated circuit.

22. The integrated circuit of claim 1 wherein the integrated circuit is part of an application specific integrated circuit.

23. The integrated circuit of claim 1 wherein the integrated circuit is part of a digital signal processor.

24. The integrated circuit of claim 1 wherein the memory configuration is part of a microprocessor.

25. The integrated circuit of claim 1 wherein each of the first and second SOI transistors is an n-channel transistor.

26. The integrated circuit of claim 1 wherein each of the first and second SOI transistors is a p-channel transistor.

27. The integrated circuit of claim 1:
wherein the one of the plurality of nodes of the first SOI transistor connected to receive a first differential input signal is the gate of the first SOI transistor; and
wherein the same one of the plurality of nodes of the second SOI transistor connected to receive a second differential input signal is the gate of the second SOI transistor.

28. The integrated circuit of claim 27 and further comprising a third SOI transistor having a first source/drain connected to the first source/drain of the first SOI transistor and the first source/drain of the second SOI transistor, having a gate connected to receive an amplify signal, and having a second source/drain connected to a fixed potential.

29. The integrated circuit of claim 28 and further comprising:
a fourth SOI transistor having a first source/drain connected to the second source/drain of the first SOI transistor and a second source/drain connected to receive a bias voltage;
a fifth SOI transistor having a first source/drain connected to the second source/drain of the second SOI transistor, a second source/drain connected to receive the bias voltage, a gate connected to a gate of the fourth SOI transistor, and a body terminal connected to the body terminal of the fourth SOI transistor.

30. The integrated circuit of claim 29:
wherein the gates of the fourth and fifth SOI transistors are further connected to the first source/drain of the fourth SOI transistor; and
wherein the first source/drain of the fifth SOI transistor is operable to output an amplified signal representative of a differential signal between the first differential input signal and the second differential input signal.

31. The integrated circuit of claim 29:
wherein the gates of the fourth and fifth SOI transistors are further connected to receive a reference voltage; and
wherein the first source/drain of the fourth SOI transistor is operable to output a first output signal;
wherein the first source/drain of the fifth SOI transistor is operable to output a second output signal;
and wherein a difference between the first and second output signals is an amplified signal representative of a differential signal between the first differential input signal and the second differential input signal.

32. The integrated circuit of claim 1:
wherein the body of the first SOI transistor is connected to the body of the second SOI transistor by way of a conductor having an RC time constant; and
wherein the RC time constant is adjusted to a time period approximately equal to a time period between consecutive accesses of the integrated circuit.

33. The integrated circuit of claim 32:
wherein the integrated circuit is synchronously accessed once per a clock cycle; and
wherein the RC time constant is adjusted to a time period approximately equal to the clock cycle.

34. The integrated circuit of claim 32:
wherein the integrated circuit is asynchronously accessed; and
wherein the RC time constant is adjusted to a time period approximately equal to a minimum period of time between expected successive asynchronous accesses of the integrated circuit.

* * * * *